(12) United States Patent
Krause et al.

(10) Patent No.: US 7,939,437 B2
(45) Date of Patent: May 10, 2011

(54) METALLIZATION METHOD FOR SOLAR CELLS

(75) Inventors: Andreas Krause, Dresden (DE); Bernd Bitnar, Freiberg (DE); Holger Neuhaus, Freiberg (DE)

(73) Assignee: Deutsche Cell GmbH, Freiberg/Sachsen (DE)

( * ) Notice: Subject to any disclaimer, the term of this patent is extended or adjusted under 35 U.S.C. 154(b) by 13 days.

(21) Appl. No.: 12/482,737

(22) Filed: Jun. 11, 2009

(65) Prior Publication Data

US 2009/0311825 A1    Dec. 17, 2009

(30) Foreign Application Priority Data

Jun. 13, 2008   (DE) .................. 10 2008 028 104

(51) Int. Cl.
*H01L 21/20* (2006.01)
*H01L 21/36* (2006.01)
(52) U.S. Cl. . 438/508; 438/505; 438/753; 257/E21.006; 257/E21.229; 257/E21.308; 257/E21.312; 257/E21.315; 257/E21.327

(58) Field of Classification Search .................. 438/505, 438/508, 637, 683, 685, 687, 752, 753, 706; 257/E21.006, 229, 308, 312, 315, 327
See application file for complete search history.

(56) References Cited

U.S. PATENT DOCUMENTS

| | | | | |
|---|---|---|---|---|
| 3,350,775 A | | 11/1967 | Iles | |
| 4,256,513 A | * | 3/1981 | Yoshida et al. | 136/256 |
| 4,703,553 A | * | 11/1987 | Mardesich | 257/447 |
| 4,818,337 A | * | 4/1989 | Barnett et al. | 257/431 |
| 5,011,565 A | * | 4/1991 | Dube et al. | 156/844 |
| 5,591,565 A | * | 1/1997 | Holdermann et al. | 438/98 |

FOREIGN PATENT DOCUMENTS

| | | |
|---|---|---|
| DE | 112004000600 | 2/2006 |
| DE | 1020070387744 | 2/2009 |
| WO | WO 2006/005116 | 1/2006 |

* cited by examiner

*Primary Examiner* — David Nhu
(74) *Attorney, Agent, or Firm* — McGlew and Tuttle, P.C.

(57) ABSTRACT

A method for the production of a contact structure of a solar cell allows p-contacts and n-contacts to be produced simultaneously.

15 Claims, 3 Drawing Sheets

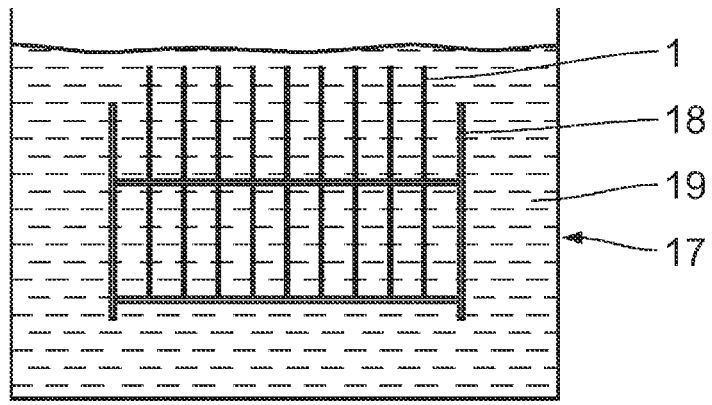
Fig. 3
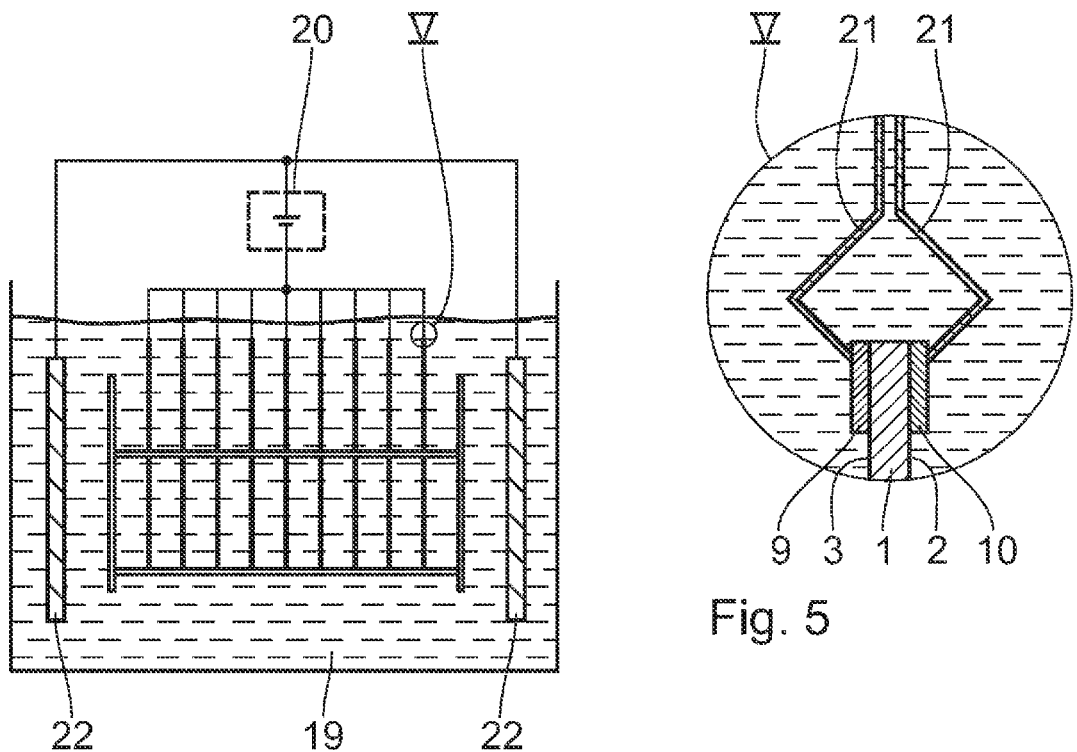
Fig. 4
Fig. 5

METALLIZATION METHOD FOR SOLAR CELLS

CROSS REFERENCE TO RELATED APPLICATIONS

This application claims the benefit of priority under 35 U.S.C. §119 of German patent application DE 10 2008 028 104.2 filed Jun. 13, 2008, the entire contents of which are incorporated herein by reference.

FIELD OF THE INVENTION

The invention relates to a method for the production of a contact structure of a semiconductor component, in particular of a solar cell.

BACKGROUND OF THE INVENTION

When producing solar cells, metal contacts are conventionally applied to a silicon substrate by means of screen printing. The application of the contacts to the front and back sides of a solar cell takes place in succession with in each case one drying step after each screen printing step. This requires a substantial amount of time and effort.

SUMMARY OF THE INVENTION

It is therefore the object of the invention to provide a method which facilitates the production of a contact structure of a semiconductor substrate, in particular of a solar cell.

This object is achieved by a method for the production of a contact structure of a semiconductor component, in particular of a solar cell, the method comprising the steps of providing a semiconductor substrate comprising a first side, a second side opposite to said first side, at least one p-doped region and at least one n-doped region, metallizing at least a portion of the regions in order to produce at least one p-contact which is in electrical contact with the at least one p-doped region and at least one n-contact which is in electrical contact with the at least one n-doped region, with the at least one p-contact and the at least one n-contact being produced simultaneously.

The gist of the invention is to produce p- and n-contacts of a semiconductor component simultaneously. This reduces the number of process steps required to produce the contacts, which results in time and cost savings.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 3 is a diagrammatic view of a batch plant according to the invention for performing a currentless metal deposition;

FIG. 4 is a diagrammatic view of a batch plant according to the invention for galvanic metal deposition;

FIG. 5 is an enlarged view of region V in FIG. 4;

DESCRIPTION OF THE PREFERRED EMBODIMENTS

Figure 1:
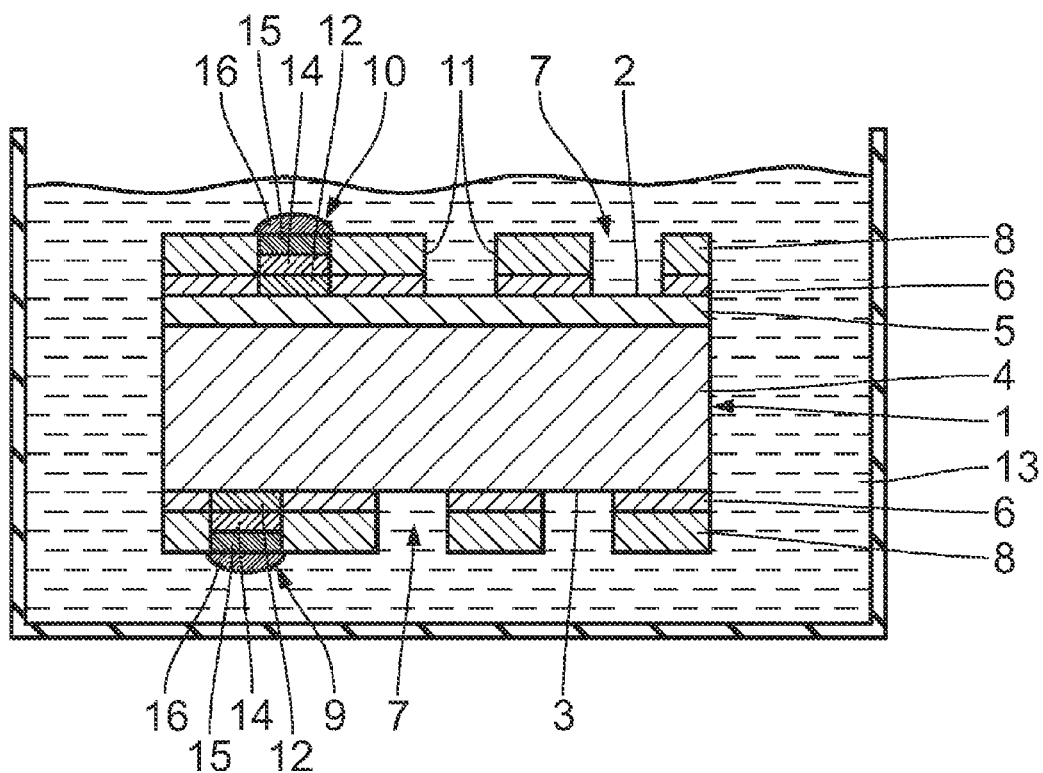
FIG. 1 is a diagrammatic view of the method according to a first embodiment.

The following is a description of a first embodiment of the invention with reference to FIG. 1. In a first step, a flat—in other words two-dimensional—semiconductor substrate 1 having a front side 2 and a back side 3 is doped with a dopant by means of processes known to those skilled in the art. After doping, the semiconductor substrate 1 comprises at least one p-doped region 4 and at least one n-doped region 5. According to the first embodiment of the invention, both the p-doped region 4 and the n-doped region 5 are simply connected. The p-doped region 4 and the n-doped region 5 are arranged on opposite sides 2, 3 of the semiconductor substrate 1.

The semiconductor substrate 1 may for instance be a silicon wafer. The semiconductor substrate 1 may however consist of another semiconductor material as well, for instance germanium, a compound semiconductor or an organic semiconductor. The semiconductor substrate 1 is in particular used for the production of a solar cell.

In a preprocessing step, a dielectric insulation layer 6 is applied to the semiconductor substrate 1. The insulation layer 6 initially covers both the p-doped region 4 and the n-doped region 5 completely. The insulation layer 6 serves as an anti-reflection layer. It advantageously consists of silicon nitride. It may also consist of silicon dioxide.

Regions of the insulation layer 6 are then provided with openings 7, advantageously by means of a laser or etching process. To this end, the insulation layer 6 is at first provided with a mask 8 of an organic material, in particular of epoxy resin or paraffin. Alternatively, the insulation layer 6 may also be structured by means of a laser process. It is conceivable for the mask 8 to be applied before the laser process is performed, which allows the mask 8 to be structured simultaneously with the insulation layer 6 by means of the laser. The mask 8 is applied by means of a printing method, in particular an inkjet printing method. The mask 8 may assume the function of the insulation layer 6 so that the insulation layer 6 can be dispensed with in an alternative embodiment. Advantageously, the semiconductor substrate 1 is additionally doped in the region of the openings 7 when the insulation layer 6 is opened.

The openings 7 extend through the entire mask 8 and the entire insulation layer 6 in such a way that the p-doped region 4 of the semiconductor substrate 1 is exposed in those regions of the semiconductor substrate 1 which are to be provided with p-contacts 9. Correspondingly, the n-doped region 5 of the semiconductor substrate 1 is exposed in those regions after opening the insulation layer 6 where n-contacts 10 are to be provided. The openings 7 are laterally bounded by flanks 11 of the mask 8. The flanks 11 are at least approximately perpendicular to the sides 2, 3 of the semiconductor substrate 1. An alternative geometric design of the mask 8, in particular of the flanks 11 thereof, is of course conceivable as well in order to obtain an alternative geometric shape of the openings 7 and therefore of the contacts 9, 10 arranged in the openings 7.

In order to produce the contacts 9, 10, the semiconductor substrate 1 is metallized in the region of the openings 7 by currentless metal deposition of a seed layer 12 of metal. According to the invention, metals such as nickel, cobalt, palladium, silver, chromium or an alloy of the aforementioned metals are deposited to form the seed layer 12. Deposition of the seed layer 12 takes place by immersing the semiconductor substrate 1 in a chemical solution 13. According to the invention, the entire semiconductor substrate 1 comprising both the p-doped region 4 and the n-doped region 5 is immersed in the solution 13 completely so that the p-contacts 9 and the n-contacts 10 are deposited simultaneously. The seed layer 12 is in particular deposited on the semiconductor substrate 1 directly. The p-contacts 9 are thus in electrical contact with the p-doped region 4 of the semiconductor substrate 1. Correspondingly, the n-contacts 10 are in electrical contact with the n-doped region 5.

Alternatively, the seed layer 12 may also be applied by galvanic metal deposition instead of currentless metal deposition.

The method according to the invention therefore allows front and back side contacts of a semiconductor substrate 1 to be produced in a single process step and in a single plant.

In subsequent process steps, the contacts 9, 10 are thickened by means of a diffusion barrier layer 14 of nickel and/or cobalt, a conductive layer 15 in particular of copper, and a protective layer 16 in particular of silver, tin or nickel which are deposited on the seed layer 12. The contacts 9, 10 therefore comprise several layers, namely the seed layer 12, the diffusion barrier layer 14, the conductive layer 15 and the protective layer 16. Further details of the contacts 9, 10 are described in DE 10 2007 038 744.1. It shall be noted that the layers 12, 14, 15 and 16 and the semiconductor substrate 1 shown in the Figures, the semiconductor substrate 1 comprising the regions 4 and 5, are not to scale and are for illustration of the inventive method only.

The layers 14, 15, 16 are deposited on the seed layer 12 by means of chemical processes and/or galvanic metal deposition. What is important is that the deposition of the layers 14, 15, 16 in the region of the p-contacts 9 and the n-contacts 10 may take place simultaneously as well.

If necessary, thickening of the contacts 9, 10 by means of the layers 14, 15, 16 may also take place in succession. Applying the thickening layers to one side only in particular makes sense if the p-contacts 9 on the back side 3 of the semiconductor substrate 1 are to be provided with a different coating than the n-contacts 10 on the front side 2 of the semiconductor substrate 1.

When performing a galvanic metal deposition, the potentials applied to the p-contacts 9 and the n-contacts 10 can be selected in such a way that the current density in one of the two regions is higher than in the other region so that this region is thus coated more rapidly, in other words the resulting layer thickness is greater than in the other contact region. It is of course conceivable as well for the layers 12, 14, 15 and 16 of the p-contacts 9 to be formed with a thickness which is identical to that of the corresponding layers 12, 14, 15 and 16 of the n-contacts 10.

The deposition of the layers 14, 15 and 16 on the seed layer 12 causes the contacts 9, 10 to be thickened, which in particular results in an increased aspect ratio, the aspect ratio being the ratio of the height to the width of the contacts.

Deposition of the layers 12, 14, 14 and 16 may take place in a batch plant 17 as shown in FIG. 3. To this end, a plurality of semiconductor substrates 1 is arranged in a retaining device 18 and immersed in a bath 19 by means of said retaining device 18.

Galvanic metal deposition is performed by connecting the contacts 9, 10 to the cathode of a direct current source 20 as shown in FIG. 4. To this end, contact clamps 21 are provided which enclose the edges of the semiconductor substrate 1, thereby pressing spring contacts to the contacts 9, 10 on the front and back sides 2, 3 of the semiconductor substrate 1 as shown in FIG. 5. In the bath 19 are disposed anodes which are connected to the anode of the direct current source 20, thus allowing the circuit to be closed.

In order to produce the entire contact structure, several baths 19 may be arranged in succession, with a rinsing bath being provided between in each case two metallization baths.

Figure 6:
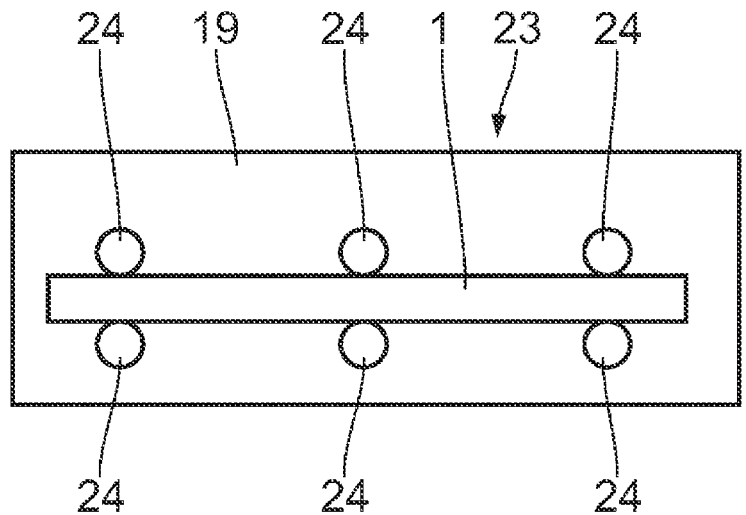
FIG. 6 is a diagrammatic view of a continuous processing plant according to the invention for currentless metal deposition.
Figure 7:
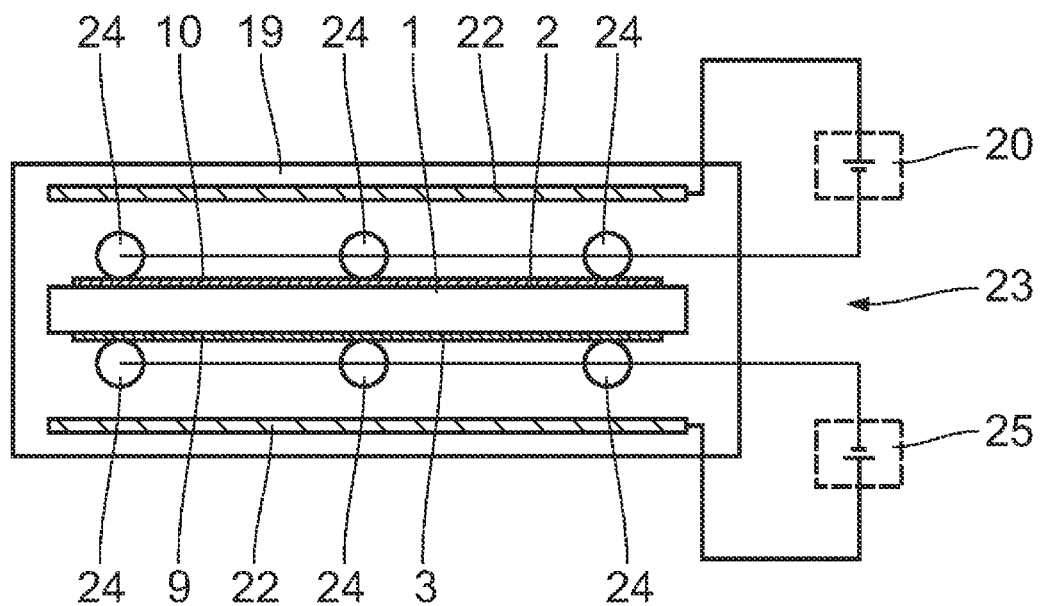
FIG. 7 is a diagrammatic view of a continuous processing plant according to the invention for galvanic metal deposition.

Alternatively, a continuous processing plant 23 as shown in FIG. 6 may be provided instead of the batch plant 17 of FIG. 3. The continuous processing plant 23 comprises a plurality of conveyor rollers 24 by means of which the semiconductor substrate 1 is movable through the bath 19. In each case two conveyor rollers 24 are arranged opposite to each other with respect to the semiconductor substrate, the distance being adaptable to the thickness of the semiconductor substrate 1. The conveyor rollers 24 are rotatable about their respective axis; they are in particular drivable for rotation. In order to perform a galvanic metal deposition, the conveyor rollers 24 at the front side 2 of the semiconductor substrate 1 are electrically connected to the cathode of the direct current source 20. Correspondingly, the conveyor rollers 24 at the back side 3 of the semiconductor substrate 1 are connected to the cathode of a second direct current source 25. The voltage applied to the p-contacts 9 is therefore adjustable independently of the voltage applied to the n-contacts 10. The conveyor rollers 24 at the back side 3 may of course also be connected to the cathode of the direct current source 20 so that the second direct current source 25 can be dispensed with as shown in FIG. 7. The conveyor rollers 24 comprise an electrically conductive surface so that a contact is established between the direct current source 20, 25 and the contacts 9, 10 of the semiconductor substrate 1 (see FIG. 7).

Several continuous processing plants 23 may advantageously be arranged in succession, with in each case one rinsing device being provided between two continuous processing plants 23.

Figure 2:
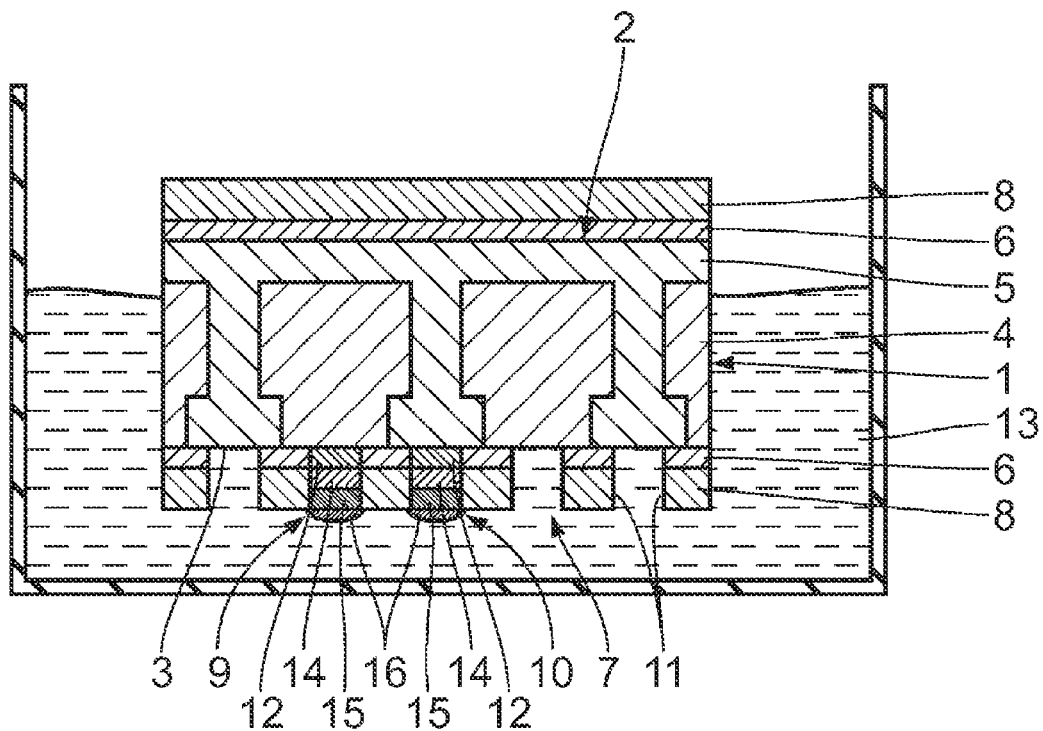
FIG. 2 is a diagrammatic view of the method according to a second embodiment.

The following is a description of another embodiment of the invention with reference to FIG. 2. Identical parts are denoted by the same reference numerals as in the first embodiment to the description of which reference is made.

The main difference to the first embodiment is that both the p-doped regions 4 and the n-doped regions 5 are arranged on the back side 3 of the semiconductor substrate 1 as shown in FIG. 2. This is for instance the case in back side contact solar cells, in particular in so-called emitter warp through (EWT) solar cells and in interdigitated back contact (IBC) solar cells. In this embodiment, the insulation layer 6 completely covers the front side 2 of the semiconductor substrate 1. In other words, no openings 7 are provided in the insulation layer 6 on the front side 2 of the semiconductor substrate 1. The layers 12, 14, 15 and 16 are then only deposited in the regions defined by the openings 7 on the back side 3 of the semiconductor substrate 1. In this embodiment, it is therefore not necessary for the semiconductor substrate 1 to be immersed in the solution 13 completely. It is sufficient if the back side 3 of the semiconductor substrate 1 is immersed in the solution 13. This facilitates the metallization step. It is in particular sufficient if the continuous processing plant 23, which is provided for performing the metallization step, only comprises one row of conveyor rollers 24 on which the semiconductor substrate 1 is disposed with its back side 3. Alternatively, the semiconductor substrate 1 may be connected to a conveyor device, which is not shown in the Figures, via the mask 8 on the front side 2.

While specific embodiments of the invention have been described in detail to illustrate the application of the principles of the invention, it will be understood that the invention may be embodied otherwise without departing from such principles.

What is claimed is:

1. A method for producing a contact structure of a semiconductor component, the method comprising:
    providing a semiconductor substrate comprising:
        a first side;
        a second side opposite to said first side;
        at least one p-doped region; and
        at least one n-doped region;
    metallizing at least a portion of the regions in order to produce:
        at least one p-contact which is in electrical contact with the at least one p-doped region; and
        at least one n-contact which is in electrical contact with the at least one n-doped region,
    with the at least one p-contact and the at least one n-contact being produced simultaneously.

2. A method according to claim 1, wherein the semiconductor component is a solar cell.

3. A method according to claim 1, wherein at least one currentless metal deposition process is provided for metallization.

4. A method according to claim 1, wherein at least one galvanic metal deposition process is provided for metallization.

5. A method according to claim 1, wherein at least one of the group comprising nickel, cobalt, palladium, silver, chromium and an alloy of these metals is deposited on the semiconductor substrate during metallization.

6. A method according to claim 1, wherein the contacts are thickened by at least one of the group comprising a galvanic and a currentless process.

7. A method according to claim 6, wherein the thickening of the p- and n-contacts takes place simultaneously.

8. A method according to claim 6, wherein the thickening of the contacts takes place at different speeds so that the contacts have a different layer thickness.

9. A method according to claim 1, wherein the at least one p-doped region and the at least one n-doped region are arranged on opposite sides of the semiconductor substrate.

10. A method according to claim 1, wherein the at least one p-doped region and the at least one n-doped region are arranged on the same side of the semiconductor substrate.

11. A method according to claim 1, wherein the semiconductor substrate is provided with a dielectric insulation layer prior to metallization.

12. A method according to claim 11, wherein a region of the insulation layer is provided with openings prior to the production of the contacts.

13. A method according to claim 12, wherein a doping of the semiconductor substrate takes place in the region of the openings when the insulation layer is opened.

14. A method according to claim 12, wherein the insulation layer is provided with a mask of an organic material before the openings are formed.

15. A method according to claim 14, wherein the insulation layer is provided with a mask of paraffin before the openings are formed.

* * * * *